(12) United States Patent
Zenz et al.

(10) Patent No.: US 8,628,018 B2
(45) Date of Patent: Jan. 14, 2014

(54) RFID CIRCUIT AND METHOD

(75) Inventors: Christian Zenz, Graz (AT); Franz Amtmann, Graz (AT); Roland Brandl, Eggersdorf bei Graz (AT)

(73) Assignee: NXP, B.V., Eindhoven (NL)

( * ) Notice: Subject to any disclaimer, the term of this patent is extended or adjusted under 35 U.S.C. 154(b) by 0 days.

(21) Appl. No.: 13/449,069

(22) Filed: Apr. 17, 2012

(65) Prior Publication Data
US 2013/0270348 A1    Oct. 17, 2013

(51) Int. Cl.
*G06K 19/02* (2006.01)

(52) U.S. Cl.
USPC ........... 235/488; 235/380; 235/487; 235/492; 235/451

(58) Field of Classification Search
USPC ................. 235/488, 380, 492, 451, 375, 487; 340/10.1, 572.1, 572.8
See application file for complete search history.

(56) References Cited

U.S. PATENT DOCUMENTS

| | | | |
|---|---|---|---|
| 5,854,480 A | 12/1998 | Noto | |
| 6,265,977 B1 * | 7/2001 | Vega et al. | 340/572.7 |
| 6,407,669 B1 | 6/2002 | Brown | |
| 6,815,809 B2 | 11/2004 | Bordes | |
| 6,900,536 B1 | 5/2005 | Derbenwick | |
| 2008/0186245 A1 * | 8/2008 | Hilgers | 343/803 |
| 2008/0284605 A1 * | 11/2008 | Shafer et al. | 340/572.7 |
| 2009/0051539 A1 * | 2/2009 | Ho | 340/572.7 |

FOREIGN PATENT DOCUMENTS

EP    2410565 A1    1/2012

* cited by examiner

*Primary Examiner* — Edwyn Labaze

(57) ABSTRACT

Radio frequency communications are effected. In accordance with one or more embodiments, a radio frequency communication circuit includes an antenna having a conductor and a semiconductor chip having a lower substrate surface coupled with the conductor to pass data carried by radio frequency signals to a radio frequency communication circuit in an active layer on an upper surface of the substrate. Accordingly, communications are facilitated via the substrate and can alleviate the need to use through-substrate connectors and further facilitate placement of the chip on the antenna.

20 Claims, 7 Drawing Sheets

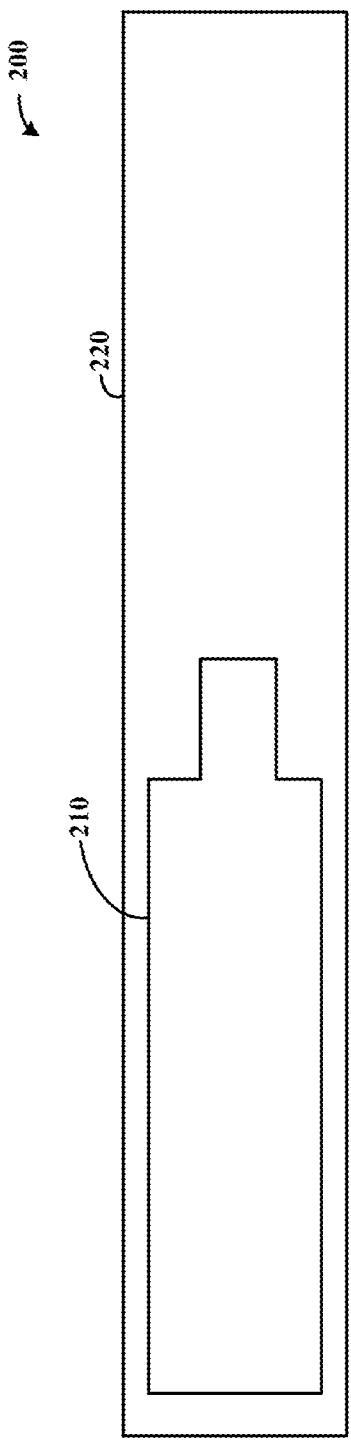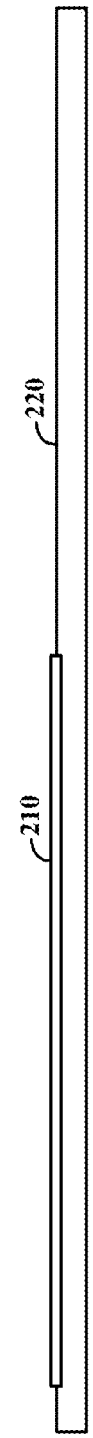
FIG. 2A
FIG. 2B

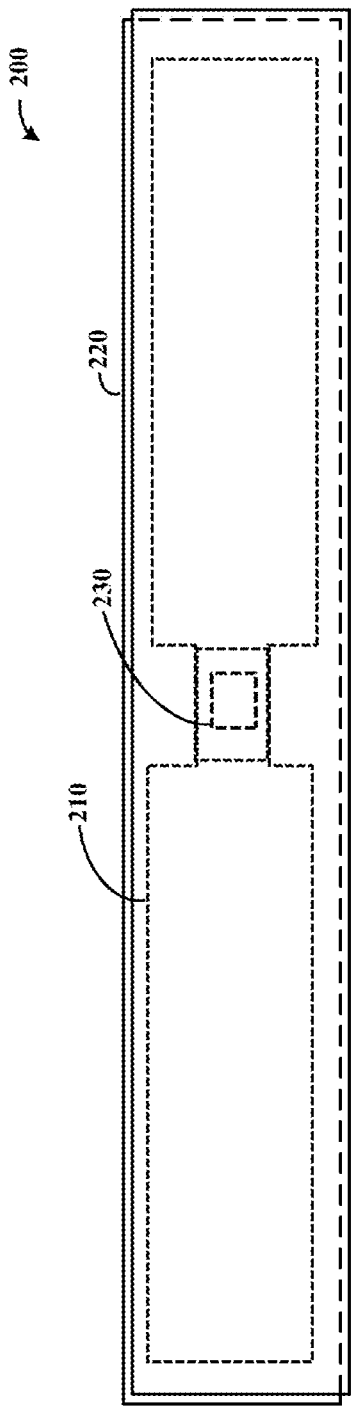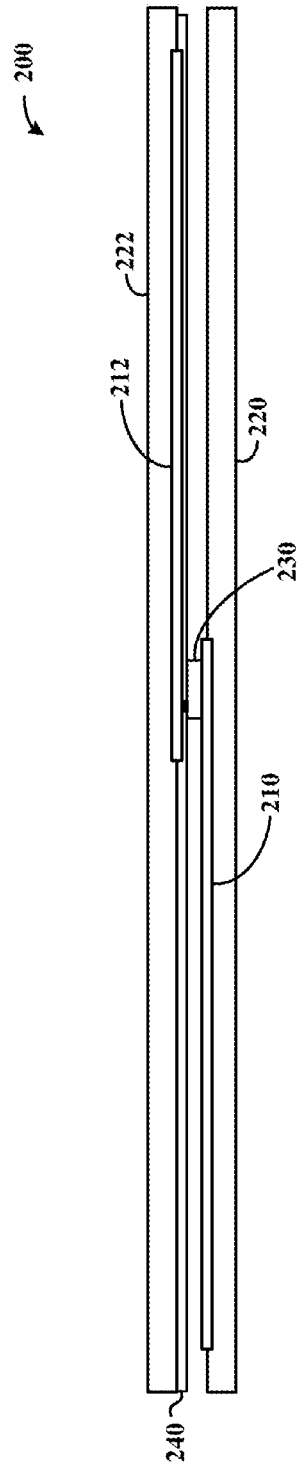
FIG. 2E
FIG. 2F

RFID CIRCUIT AND METHOD

Aspects of various embodiments of the present invention are directed to radio frequency communications, and to apparatuses and methods for radio frequency identification (RFID).

Radio-frequency communications, such as for radio-frequency identification (RFID), are used in a variety of applications. For example, in RFID applications, communications are effected between a reader and a transponder, with the transponder providing identification (or other) data in response to communications from the reader or in a TTF (tag talks first) mode by powering up. For instance, the transponder can be part of a tag such as an RFID tag (or be the tag), or part of another object affixed to a subject or object to be identified.

RFID assembly processes require high accuracy during antenna manufacturing (resolution for the contact leads in the die landing area) as well as high placement accuracy during the assembly process as a result of the small IC sizes using standard CMOS processes. In that case, all contact pads for at least one antenna on the IC are placed on an active side of a Silicon (or other base material) wafer in which the RFID circuit is formed. For example, RFID chip sizes can be in the range of 0.2-0.4 mm in length/width, with respective contact pads being separated by much smaller distances. Accurately placing such chips can be difficult, resulting in high production costs.

These and other issues continue to present challenges to the manufacture and implementation of RFID tags and other related circuits.

Various example embodiments are directed to RFID circuits and their implementation. In accordance with an example embodiment, a radio frequency identification (RFID) tag includes an antenna having first and second antenna portions for transceiving data, and an RFID chip positioned between the first and second antenna portions. The RFID chip includes a semiconductor substrate, an active layer on the semiconductor substrate, and a radio frequency communication circuit (e.g., including doped regions of the active layer). The semiconductor substrate has a lower surface area that faces the first antenna portion and communicates data, carried by radio frequency signals, between the first antenna portion and the radio frequency communication circuit. A conductor connects the radio frequency communication circuit to the second antenna portion, to facilitate communication of the data carried by radio frequency signals between the second antenna portion and the radio frequency communication circuit.

Another example embodiment is directed to a radio frequency communication circuit having an antenna with a planar conductor, and a semiconductor chip having an active semiconductor layer on a bulk semiconductor substrate. The active semiconductor region includes a radio frequency communication circuit, and the semiconductor substrate has a planar lower surface area that is parallel to the planar conductor, with most or all of the lower surface area being in direct contact with the planar conductor. The radio frequency communication circuit, planar conductor and semiconductor substrate are configured and arranged together to pass data, carried by radio frequency signals, between the antenna and the radio frequency communication circuit via the semiconductor substrate.

Another example embodiment is directed to a method of manufacturing an apparatus. About all of a lower surface of an RFID chip is connected to a first antenna portion, and the RFID chip is electrically connected to the first antenna portion. The RFID chip has a radio frequency circuit in an active layer at an upper surface of the RFID chip that is on an underlying substrate, and opposite the lower surface of the RFID chip. The lower surface and the first antenna connection are connected for communicating data carried by radio frequency signals between the first antenna connection and the radio frequency circuit through the substrate. A second antenna portion is laminated to the first antenna portion and electrically connected to an upper surface of the RFID chip, using a laminating material to secure the second antenna portion to the upper surface and extending a conductive contact through the laminating material to connect the second antenna portion to a radio frequency circuit at the upper surface.

The above discussion/summary is not intended to describe each embodiment or every implementation of the present disclosure. The figures and detailed description that follow also exemplify various embodiments.

Various example embodiments may be more completely understood in consideration of the following detailed description in connection with the accompanying drawings, in which:

FIGS. 2A-2F show an RFID tag at various stages of manufacture, in accordance with other example embodiments of the present invention;

Figure 1:
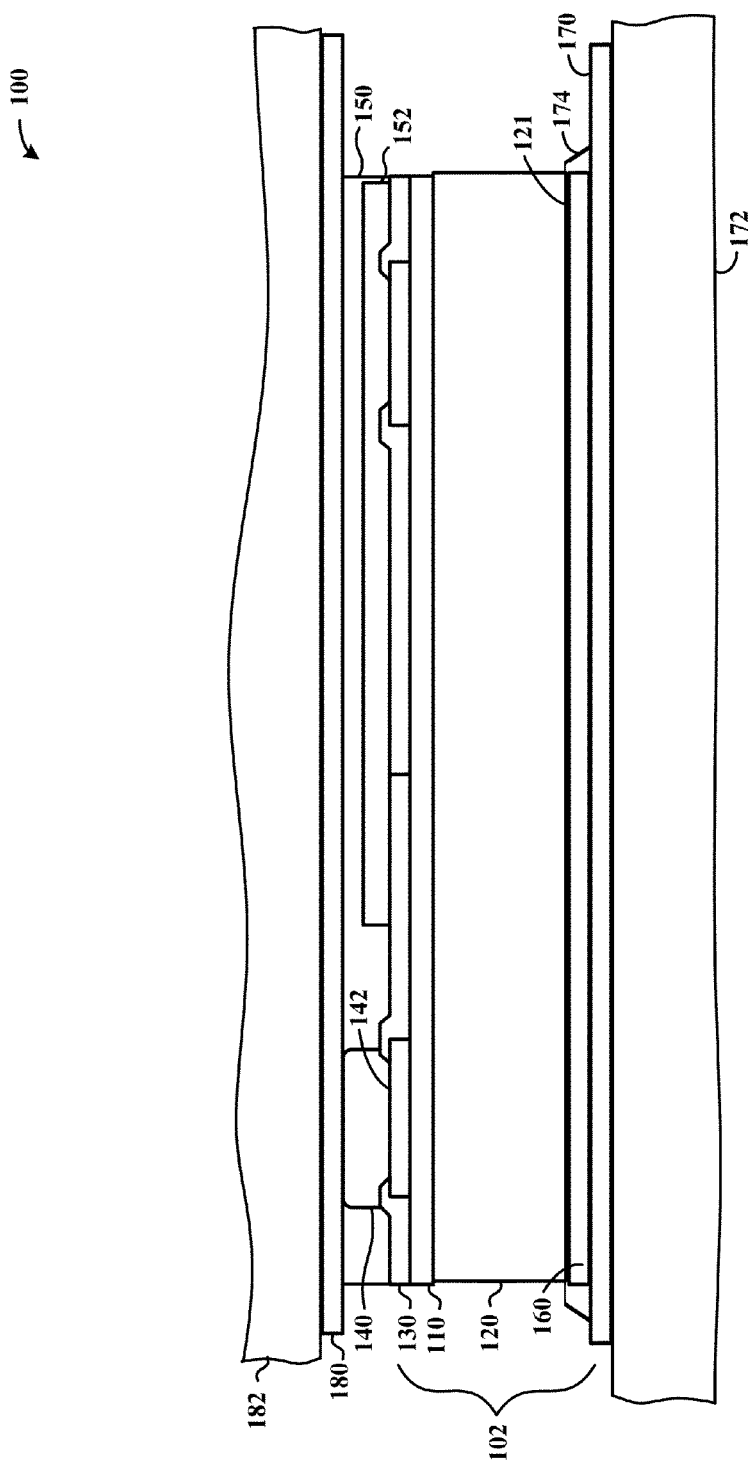
FIG. 1 shows an RFID tag having a radio frequency circuit coupled to an antenna portion via a semiconductor substrate, in accordance with an example embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the invention including aspects defined in the claims. In addition, the term "example" as used throughout this application is only by way of illustration, and not limitation.

Aspects of the present invention are believed to be applicable to a variety of different types of devices, systems and arrangements involving radio frequency communications, and to such devices employing radio frequency identification (RFID). While the present invention is not necessarily so limited, various aspects of the invention may be appreciated through a discussion of examples using this context.

Various example embodiments are directed to an RFID device having a circuit-to-antenna connection that is through a substrate upon which circuit components of the RFID device are formed. In some implementations, the RFID device is an RFID tag in which an RFID chip is laminated between respective antenna portions on opposing surfaces of the chip, and with at least one of the antenna portions connected to circuit components of the RFID device via an underlying substrate in the chip and upon which the circuit is formed.

Accordingly, the substrate passes radio frequency signals that are received at the antenna, through the substrate to the circuit components (e.g., corresponding to a voltage induced at the antenna). This can be accomplished without necessarily employing a conductor extending through the underlying substrate for contacting the antenna portion. In addition, contact between the RFID chip and the antenna can be made through a surface of such an underlying substrate, which mitigates alignment issues with conductors/vias extending through the substrate, and which can be useful for addressing challenges including those discussed above. In addition, such an RFID chip can be manufactured using CMOS type device processing, which may employ connector/bump type structures (e.g., stitch bump, Au-bump, or Cu-pillar, Solderballs) for front-side connection to an antenna with through-substrate connection to a back-side antenna.

In connection with one or more embodiments, it has been discovered that connection between an antenna and active regions of an integrated circuit chip can be made through a substrate upon which the active regions are formed. In this context, various embodiments are directed to apparatuses including antennas respectively coupled to communicate radio frequency data to active regions of an integrated circuit chip, by way of an underlying substrate.

A more particular example embodiment is directed to a radio frequency circuit, as may involve RFID communications, having an antenna with a planar conductor connected to a lower surface of a semiconductor chip for communicating data carried by radio frequency signals, via a backside substrate of the chip, to a front-side active layer in which radio frequency circuitry lies. Most or all of the lower surface area is in direct contact with the planar conductor, in contact via a metallization layer or capacitively coupled with the planar conductor. Another conductor can be connected with the front-side active layer (e.g., via a direct conductor, such as a conductive bump or other circuit), and act with the planar conductor to communicate radio frequency signals. The respective antenna portions are laminated to the chip. Further, data communications between the planar conductor on the backside and the active layer (and forming an antenna loop with the other conductor) can be limited to the backside substrate. In addition, such communications can be effected for powering the radio frequency circuit via wireless RF signals received at the antenna, for transceiving radio frequency signals.

A more particular example embodiment is directed to a radio frequency identification (RFID) tag having an antenna with first and second antenna portions for transceiving data, and a RFID chip positioned between the antenna portions. The chip includes an active layer on a semiconductor substrate, with a radio frequency communication circuit including doped regions of the active layer. A lower surface area of the chip (or a conductive layer thereupon) is in contact with the first antenna portion and communicates data, carried by radio frequency signals, between the first antenna portion and the radio frequency communication circuit (e.g., all or almost all of the data is communicated via the substrate and closed-loop connection with the second antenna portion). The second antenna portion is connected to the radio frequency communication circuit via a conductor at an upper surface of the chip. In some implementations, radio frequency signals communicated via the antenna portions are also used to power the chip. As applicable here and to other example embodiments, reference to lower and upper components is by way of example, and the respective components being in alternate orientations (e.g., with lower and upper being left and right, or swapping lower and upper by flipping a device upside down).

The antenna portions are coupled to the chip and to one another, with different arrangements, in accordance with various example embodiments. In some implementations, the antenna portions are connected to a support structure such as paper or plastic, and laminated to the chip and to each other, and can be wrapped around sidewalls of the chip. In various embodiments, the respective antenna portions are formed with geometric shapes that facilitate coupling (and laminating) of the chip in a very thin package.

Other embodiments are directed to manufacturing an apparatus having radio frequency communication circuits. About all of a lower surface of an RFID chip as discussed herein (e.g., with or without a conductive layer thereupon) is laminated to a first antenna portion, and a second antenna portion is laminated to an upper surface of the RFID chip. The lamination is carried out such that the lower surface and the first antenna communicate data carried by radio frequency signals between the first antenna and a radio frequency circuit in the chip, through a backside substrate.

Turning now to the figures, FIG. 1 shows a cross-sectional view of an RFID tag 100 having a radio frequency circuit coupled to an antenna via a substrate, in accordance with another example embodiment of the present invention. The tag 100 includes an RFID chip 102 having RFID circuitry in active layer 110 that is formed on an underlying substrate 120. A passivation layer 130 (e.g., with silicon oxide and/or silicon nitride) is on the active layer 110, and a contact 140 that extends above the passivation layer provides an electrical connection to the active layer 110 via a contact pad 142.

The chip 102 is positioned between lower and upper antenna portions 170 and 180, respectively formed on supporting structures 172 and 182. A lamination material 150, such as an insulating glue, secures the upper antenna portion 180 to the chip 102 and to contact 140, making an electrical connection between the upper antenna portion and the active layer 110. The contact 140 thus extends through the lamination material 150, which can be effected by pressing the upper antenna portion (and supporting structure 182) firmly against the chip 102. The connection between the contact 140 and upper antenna portion 180 is made in one or more of a variety of manners, such as by conductive gluing, anisotropic conduction gluing, a pure metallic interconnection, soldering or capacitive coupling. In some instances, the lamination material 150 acts as a spacer layer and is penetrated by the contact 140. In this case the spacer layer reduces parasitic coupling between dedicated circuitry blocks in the active layers 110 and the upper antenna portion 180. An optional spacer layer 152 is shown formed at an upper portion of the chip 102, and can be implemented to electrically insulate components thereupon (e.g., unused contact pads). The chip 102 is electrically connected to the lower antenna portion 170 (and may be at least temporarily coupled via an adhesive type material 174).

The lower surface 121 of the substrate 120 passes data carried by radio frequency signals from the lower antenna portion 170, to the active layers 110. With this approach, the substrate 120 acts as a conduit for coupling data received via the antenna portion 170 (and, as relevant to antenna portion 180 acting therewith), to the active layers 110. In addition, while the chip 102 is shown with an optional metallization layer 160 in contact with the lower antenna portion 170 and a lower surface of the substrate 120, the metallization layer is omitted in various implementations in which the lower surface of the substrate is in direct contact with the lower antenna portion. In still other implementations, the lower surface 121 is fitted with a bump structure, which may include a plurality of conductors similar to the contact 140, for facilitating contact.

The antenna portions 170 and 180 may, for example, include one or more conductive types of materials such as doped semiconductor material, metallic material, and conductive ink. In addition, the antenna portions can be formed in one or more of a variety of geometric arrangements such as a loop or spiral, using a variety of approaches such as deposition, etching, printing, die cutting or combinations thereof. The supporting structures 172 and 182 are optional or may include one or more of a variety of materials, such as paper, polyethylene or other plastic, or a semiconductor type of substrate.

The thickness of the substrate 120 is set to facilitate communication of the data, via radio frequency signals, from the lower antenna portion 170 and the active region (layers) 110. In some implementations, the substrate 120 is thinned to a set thickness, such as 150 micrometers, or less.

Figure 2C:
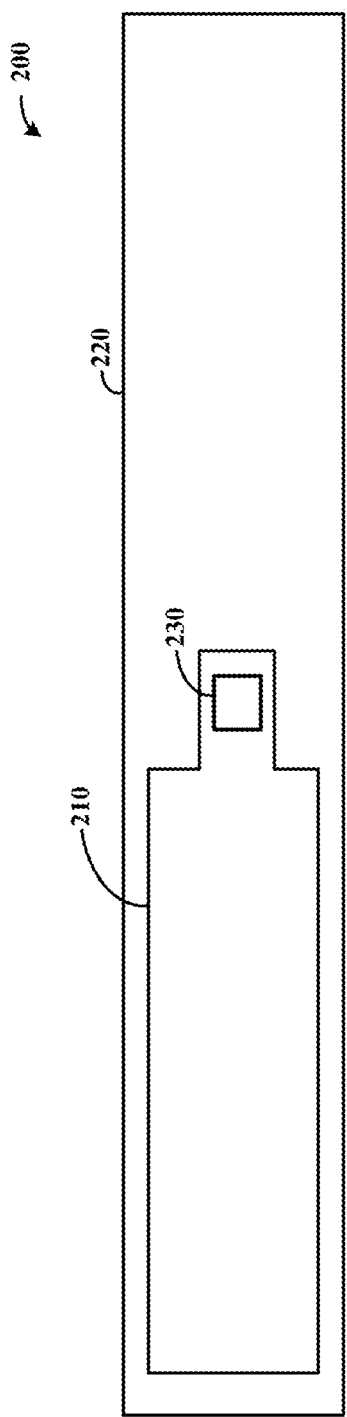
Figure 2D:
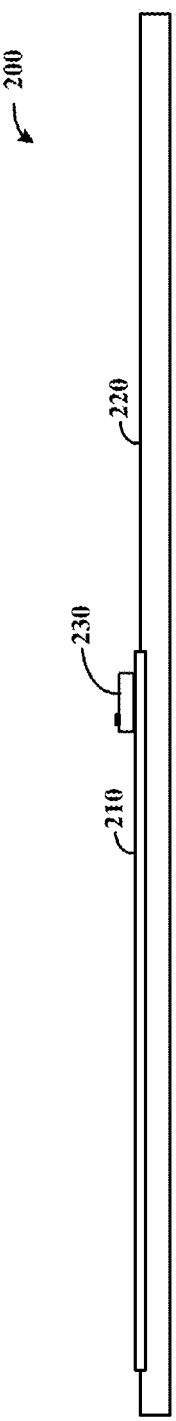

FIGS. 2A-2F show an RFID tag 200 at various stages of manufacture, in accordance with other example embodiments of the present invention. The RFID tag 200 may, for example, be implemented using an RFID chip and/or tag as shown in FIG. 1. Beginning with FIGS. 2A and 2B, top (2A) and front (2B) views are shown in which a first portion of an antenna circuit 210 is formed on a support structure 220, such as paper or polyethylene. FIGS. 2C and 2D respectively show top and bottom views, in which an RFID chip 230 has been placed on the antenna circuit 210 as shown. Most or all of a lower surface of the chip 230 is placed in contact with the antenna circuit 210, either directly or via a metallization layer, to facilitate the communication of radio frequency data through the lower surface (e.g., and through a substrate to an RFID circuit such as shown in FIG. 1 and described above).

FIGS. 2E and 2F show an antenna structure after positioning a second portion 212 of an antenna and support structure 222 on top of the lower antenna portion 210 and the RFID chip 230. As indicated by the size of the antenna portion in the area of the RFID chip 230, which is much larger than the actual RFID chip, the positioning of the two antenna portions with respect to each other and to the RFID chip is facilitated, e.g., with low positioning accuracy.

Figure 3:
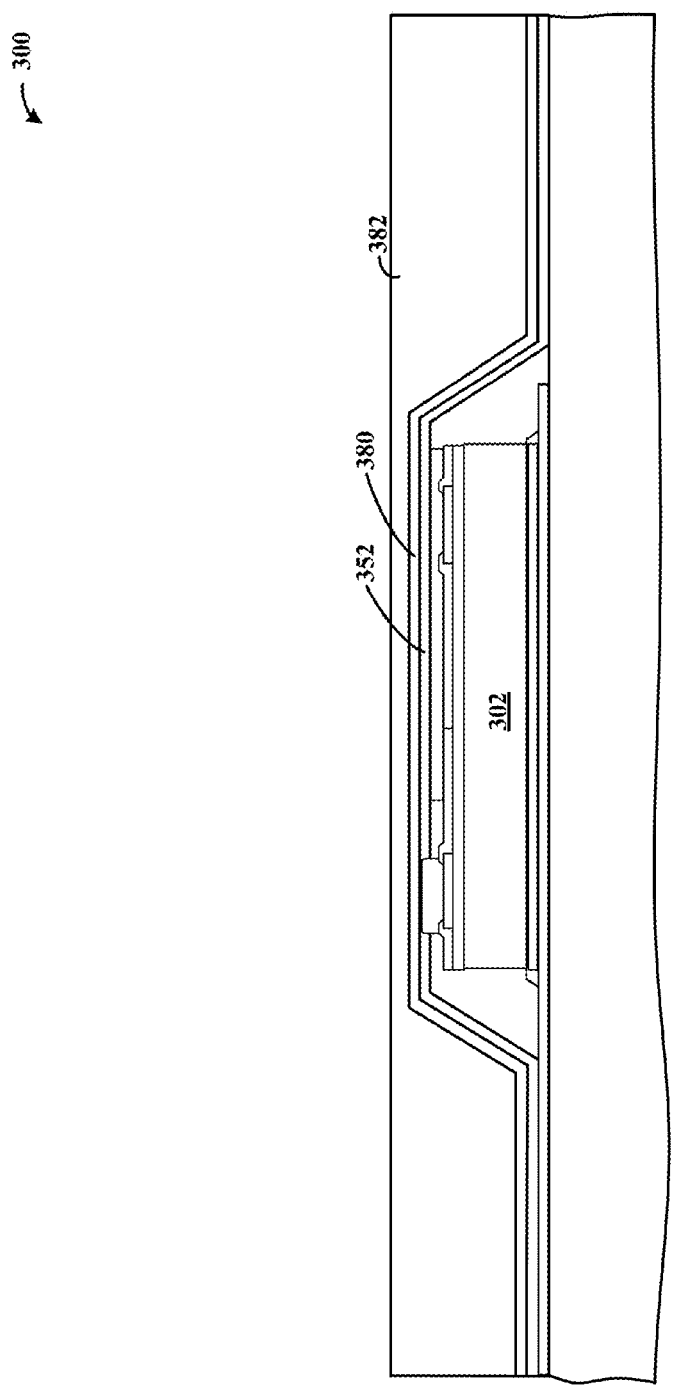
FIG. 3 shows an RFID tag, in accordance with another example embodiment of the present invention.

FIG. 3 shows a cross-section of another RFID tag 300 after lamination, in accordance with another example embodiment of the present invention. In this figure an integrated circuit 302 is pressed into the upper portion of an antenna. An upper antenna 380, on a support structure 382, is laminated to the chip 302 and a lower antenna structure by a laminating material 352. A spacer layer (such as in FIG. 1) may be implemented to safeguard the distance between active layers of the integrated circuit 302 and the upper portion of the antenna 380, which can minimize parasitic effects. In some implementations, the integrated circuit 302 is pressed into the bottom portion of the antenna, and in other implementations, is pressed into both the top and bottom portions of the antenna. These implementations can be facilitated by using substrate materials with different hardness and/or different temperatures during lamination for heating the upper and the lower substrate, which is also used in various embodiments to control the imprint of the integrated circuit 302 (e.g., such that the bump 140 in FIG. 1 is pressed into the upper antenna portion 180, whereas no or only little imprint of the integrated circuit 302 into the lower antenna portion is allowed to mitigate/prevent the lower antenna portion from being cut/broken around the integrated circuit, which can result in malfunction).

Figure 4:
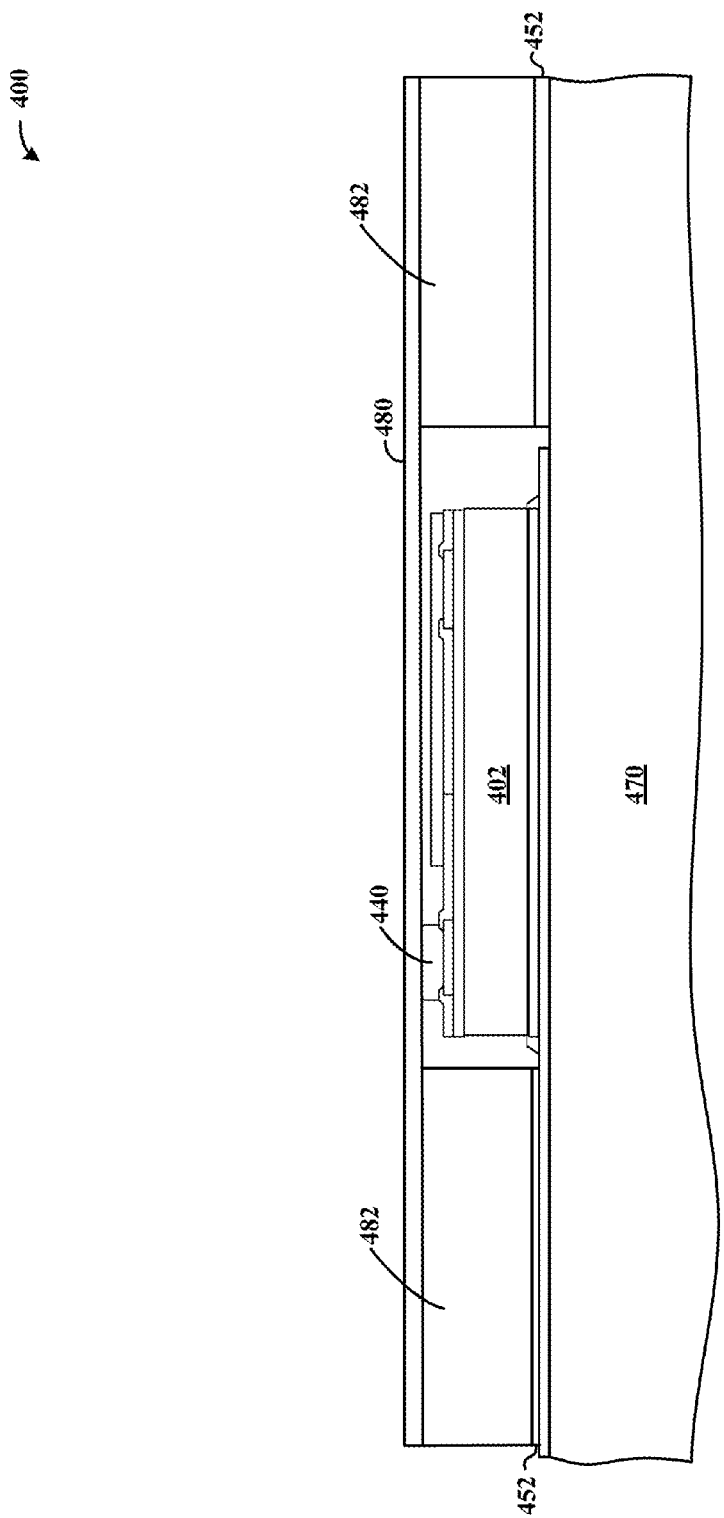
FIG. 4 shows an RFID tag, in accordance with another example embodiment of the present invention.

FIG. 4 shows a cross-section of an RFID tag 400, in accordance with another example embodiment of the present invention. The RFID tag 400 includes an RFID chip 402 and an antenna having upper and lower portions 480 and 470 connected thereto, for passing data via transceived radio frequency signals. The upper antenna portion 480 is supported by support structure layer 482 (e.g., which may extend around the RFID chip 402, with the structures shown as separate with regard to this cross-section view). Connection between the upper antenna portion 480 and the RFID chip 402 is made via connector 440, with the support structure layer 482 being laminated to the underlying antenna/support structure 470/472 via material 452. In this case, the support structure layers provide mechanical protection of the RFID chip 402 during assembly (e.g., Cutting or breaking the bottom portion of the antenna, mechanical breaking of the chip), during further processing steps and use in the field.

Figure 5:
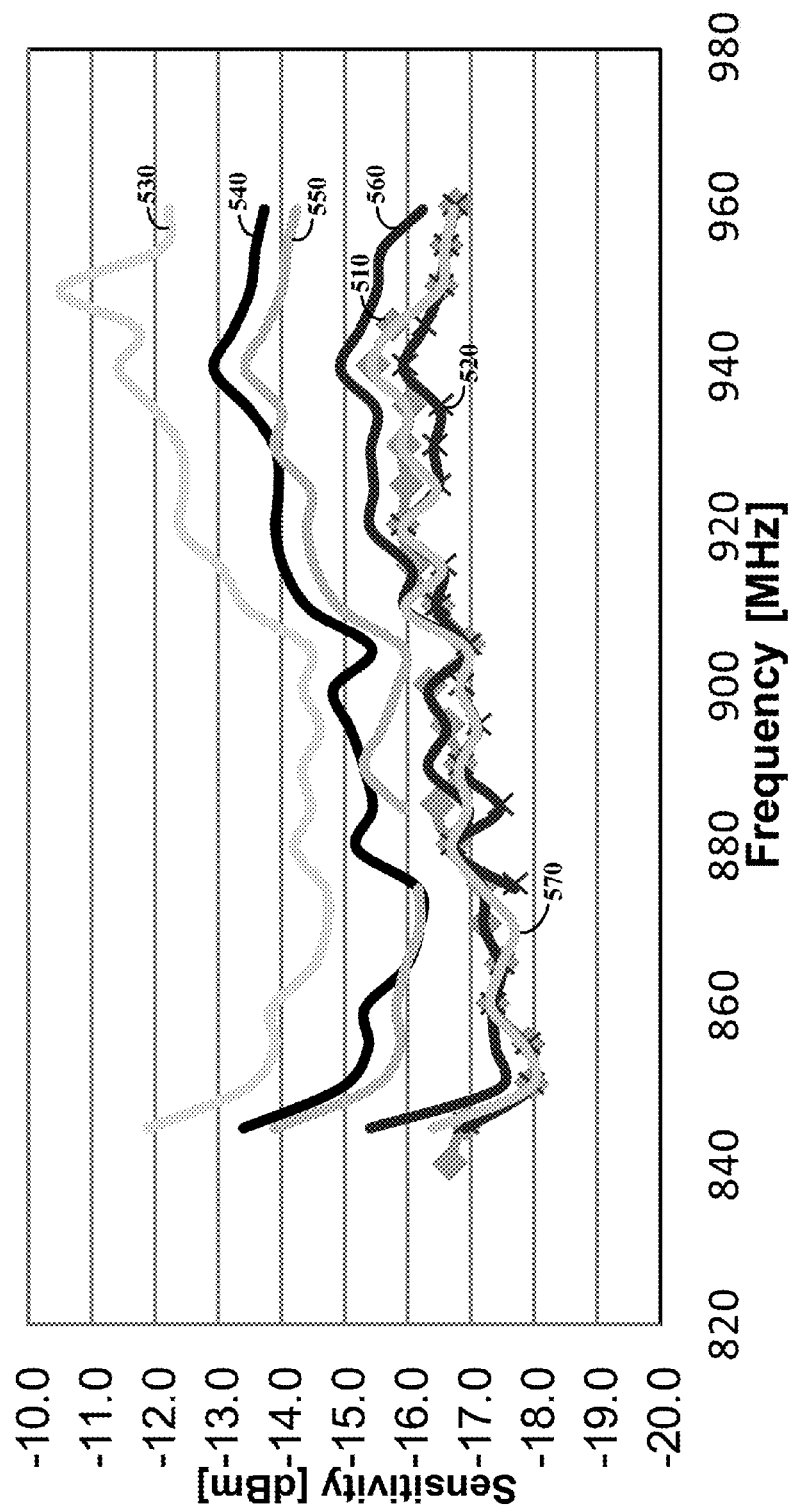
FIG. 5 shows a plot of sensitivity versus frequencies of RFID signals passed between an RFID circuit and an antenna portion via a semiconductor substrate, in accordance with another example embodiment of the present invention.

As discussed above, in connection with various embodiments it has been discovered that sufficient radio frequency signal coupling can be effected via an underlying substrate, to facilitate data communications via the radio frequency signal coupling. FIG. 5 shows a plot of sensitivity versus frequencies of RFID signals passed between an RFID circuit and an antenna portion via a semiconductor substrate, as may be achieved in accordance with this discovery and one or more example embodiments of the present invention. Sensitivity (dB) is shown on the vertical axis, and signal frequency is shown on the horizontal axis. Plots 510 and 520 represent reference RFID circuits, with plots 530, 540, 550 and 560 representing sample circuits with an antenna portion connection to an RFID circuit in an RFID chip via an underlying substrate of the chip, such as shown herein.

Based upon the above discussion and illustrations, those skilled in the art will readily recognize that various modifications and changes may be made to the present invention without strictly following the exemplary embodiments and applications illustrated and described herein. For example, other types of communication can be effected via a substrate, for devices and applications that may not necessarily involve radio frequency and RFID. In addition, a variety of different types of RFID circuits can be used in connection with the structures shown herein (e.g., with the RFID circuits shown in the active layers of the respective RFID chips shown in the figures). For general information regarding radio frequency communications, and for specific information regarding RFID circuits (or functionality thereof) that may be implemented in accordance with one or more example embodiments, reference may be made to U.S. Pat. No. 6,815,809, which is fully incorporated herein by reference. Such modifications do not depart from the true spirit and scope of the present invention, including that set forth in the following claims.

What is claimed is:

1. A radio frequency identification (RFID) tag comprising
an antenna having first and second antenna portions and configured and arranged for transceiving data;
an RFID chip laminated between the first and second antenna portions, the RFID chip including a semiconductor substrate, an active layer on the semiconductor substrate, and a radio frequency communication circuit including doped regions of the active layer, the semiconductor substrate being configured and arranged with a lower surface area that faces the first antenna portion and communicates data, carried by radio frequency signals, between the first antenna portion and the radio frequency communication circuit; and
a conductor that connects the radio frequency communication circuit to the second antenna portion, the conductor being configured and arranged with the semiconductor substrate to communicate the data carried by radio frequency signals between the second antenna portion and the radio frequency communication circuit.

2. The RFID tag of claim 1, wherein substantially all radio frequency signals communicated via the first antenna portion are passed from the lower surface area to the doped regions via the semiconductor substrate.

3. The RFID tag of claim 1, wherein the radio frequency communication circuit is configured and arranged to use the radio frequency signals to generate power for operating the radio frequency communication circuit.

4. The RFID tag of claim 1, wherein
the first and second antenna portions extend in respective planes that are parallel to one another and separated by the RFID chip, and
the entire lower surface is in direct contact with a surface of the first antenna portion.

5. The RFID tag of claim 1, further including a conductive layer on the lower surface, in direct contact with the first antenna portion, and configured and arranged to conduct the radio frequency signals between the first antenna portion and the lower surface.

6. The RFID tag of claim 1, wherein the first antenna portion is connected to a surface of a first material and the second antenna portion is connected to a surface of a second material that faces the surface of the first material, the second material being laminated to the RFID chip and to the surface of the first material.

7. The RFID tag of claim 1, further including a passivation layer between the RFID chip and the second antenna portion.

8. The RFID tag of claim 1, further including a laminating material configured and arranged to connect the second antenna portion to the RFID chip and to electrically insulate the second antenna portion from portions of the RFID chip.

9. The RFID tag of claim 8, wherein the second antenna portion is on a material that is in contact with the laminating material and wraps around sidewalls of the RFID chip that extend between the lower surface and an upper surface at which the radio frequency circuit is located.

10. The RFID tag of claim 1, wherein the semiconductor substrate between the radio frequency communication circuit and the lower surface area has a thickness of less than about 150 micrometers.

11. The RFID tag of claim 1, wherein the radio frequency circuit is configured and arranged to, in response to data received via the antenna, generate and transmit data in the form of radio frequency signals via the substrate and the antenna.

12. A radio frequency communication circuit comprising a semiconductor chip having an active semiconductor layer on a bulk semiconductor substrate, the active semiconductor layer including radio frequency circuit components, the semiconductor substrate having a lower surface area, about all of the lower surface area being in electrical contact with an antenna conductor, and the radio frequency communication circuit and semiconductor substrate being integrated together to pass data, carried by radio frequency signals, between the antenna conductor and the radio frequency circuit components via the semiconductor substrate, wherein the antenna conductor includes a section that is parallel to a section of another antenna structure and wherein the sections are separated by the semiconductor chip.

13. The circuit of claim 12, further including an antenna including the antenna conductor and another conductor in contact with the radio frequency circuit components via an upper surface of the semiconductor chip, the respective conductors being laminated to one another and to the semiconductor chip to form a laminated radio frequency circuit, the antenna conductors each including respective portions extending in planes that are parallel to one another and separated by the semiconductor chip.

14. The circuit of claim 12, wherein the semiconductor chip is configured and arranged to pass all data communications between the antenna conductor and the radio frequency circuit components via semiconductor material in the semiconductor substrate to well regions in the active semiconductor layer, the well regions being part of the radio frequency circuit components.

15. The circuit of claim 12, wherein the radio frequency communication circuit is configured and arranged to
use radio frequency signals received via the substrate to generate power for operating the radio frequency circuit components, and
in response to data received via the antenna conductor, generate and transmit data in the form of radio frequency signals via the substrate and the antenna conductor.

16. A method of manufacturing an apparatus, the method comprising:
contacting about all of a lower surface of an RFID chip to a first antenna portion, and laminating the RFID chip to the first antenna portion, the RFID chip having a radio frequency circuit in an active layer at an upper surface of the RFID chip that is on an underlying substrate and opposite the lower surface of the RFID chip, therein configuring the lower surface and the first antenna for communicating data carried by radio frequency signals between the first antenna and the radio frequency circuit through the substrate; and
laminating a second antenna portion to the upper surface of the RFID chip and to the first antenna portion, using a laminating material to secure the second antenna portion to the upper surface and extending a conductive contact through the laminating material to connect the second antenna portion to the radio frequency circuit at the upper surface.

17. The method of claim 16, wherein
the first and second antenna portions extend in respective planes that are parallel to one another and separated by the RFID chip, and
contacting about all of the lower surface of the RFID chip to the first antenna portion includes forming a conductive layer on a lower surface of the substrate and connecting the conductive layer to the first antenna portion.

18. The method of claim 16, further including forming the first and second antenna portions by forming a conductive antenna on a support structure, wherein laminating the second antenna portion includes laminating the second antenna portion to the first antenna portion via an insulating laminating material that adheres the second antenna portion to the first antenna portion and to the RFID chip.

19. The method of claim 16, further including forming a passivation layer between the chip and the second antenna portion, prior to laminating the second antenna portion.

20. The method of claim 16, further including planarizing the lower surface and reducing the thickness of the substrate to a thickness that is small enough to facilitate the communication of the data via the radio frequency signals, between the lower surface and the radio frequency circuit.

* * * * *